United States Patent [19]

Marzan

[11] Patent Number: 5,041,782
[45] Date of Patent: Aug. 20, 1991

[54] MICROSTRIP PROBE
[75] Inventor: Jose M. Marzan, Northridge, Calif.
[73] Assignee: Design Technique International, Inc., Chatsworth, Calif.
[21] Appl. No.: 410,116
[22] Filed: Sep. 20, 1989
[51] Int. Cl.$^5$ .......................... G01R 19/10; H01P 3/08
[52] U.S. Cl. ............................ 324/158 P; 324/158 F; 333/246
[58] Field of Search ............... 324/158 F, 158 P, 72.5, 324/73.1; 439/482; 333/246; 174/35 MS

[56] References Cited

U.S. PATENT DOCUMENTS

| | | | |
|---|---|---|---|
| 4,593,243 | 6/1986 | Lao et al. | 324/158 P |
| 4,697,143 | 9/1987 | Lockwood et al. | 324/158 F |
| 4,764,723 | 8/1988 | Strid | 324/158 F |
| 4,853,624 | 8/1989 | Rabjohn | 324/158 F |
| 4,853,627 | 8/1989 | Gleason et al. | 324/158 F |
| 4,983,910 | 1/1991 | Majido-Ahy et al. | 324/158 F |

Primary Examiner—Kenneth A. Wieder
Assistant Examiner—Vinh P. Nguyen
Attorney, Agent, or Firm—Poms, Smith, Lande & Rose

[57] ABSTRACT

A microstrip probe includes a microstrip transmission line constructed from a dielectric substrate having a conductive microstrip thereon. The substrate is carried by a carrier which forms the ground plane for the microstrip transmission line. A retractable ground pin projects outwardly from the forward edge of the carrier and also extends past the forward edge of the substrate.

8 Claims, 3 Drawing Sheets

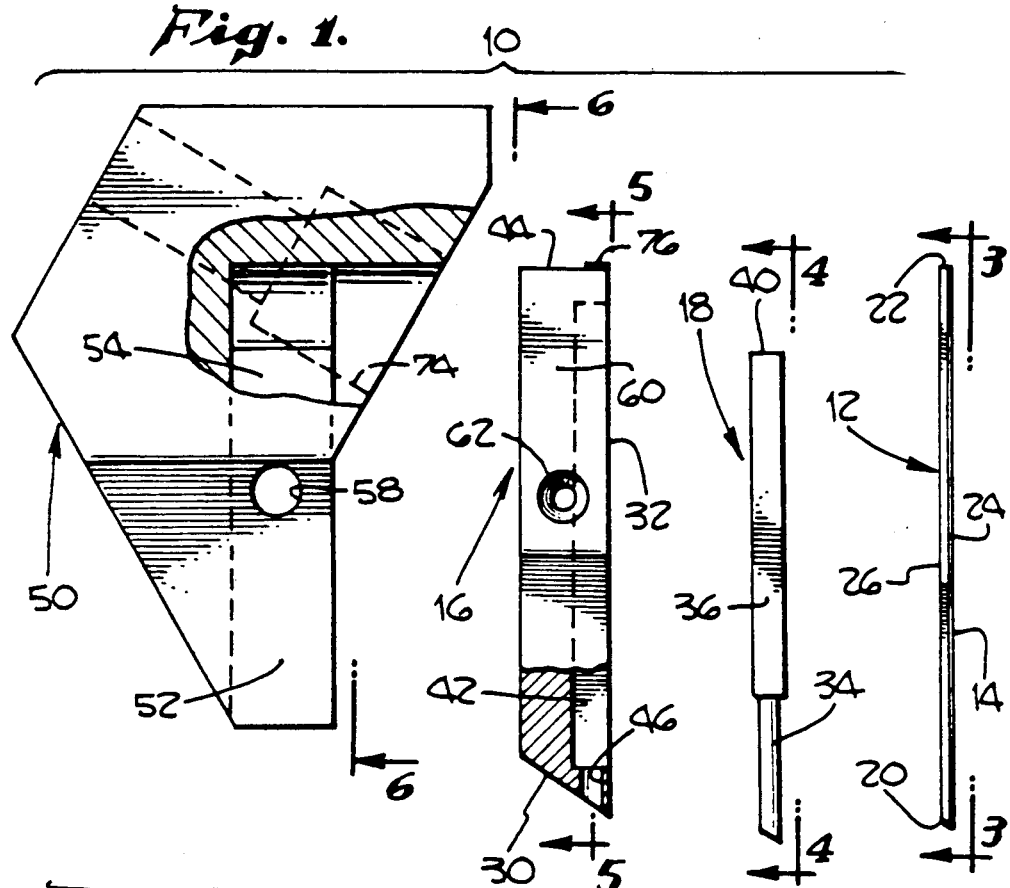
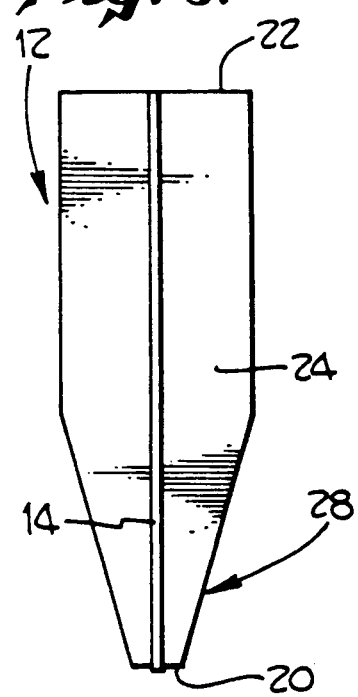
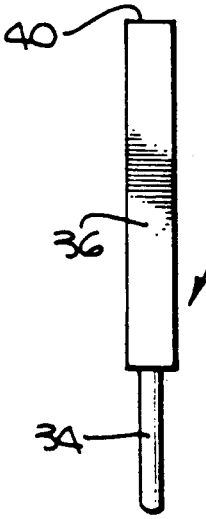
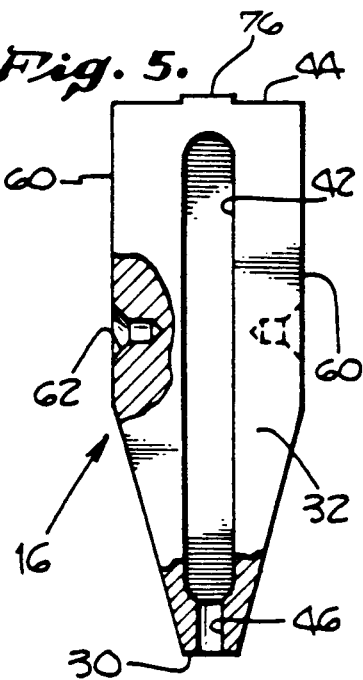

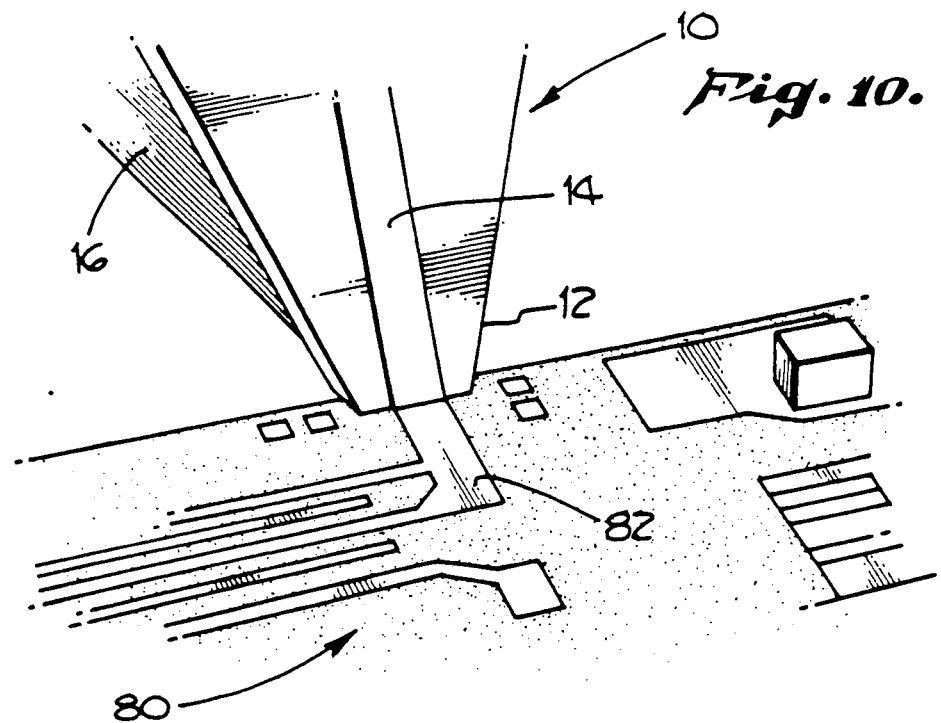
Fig. 10.
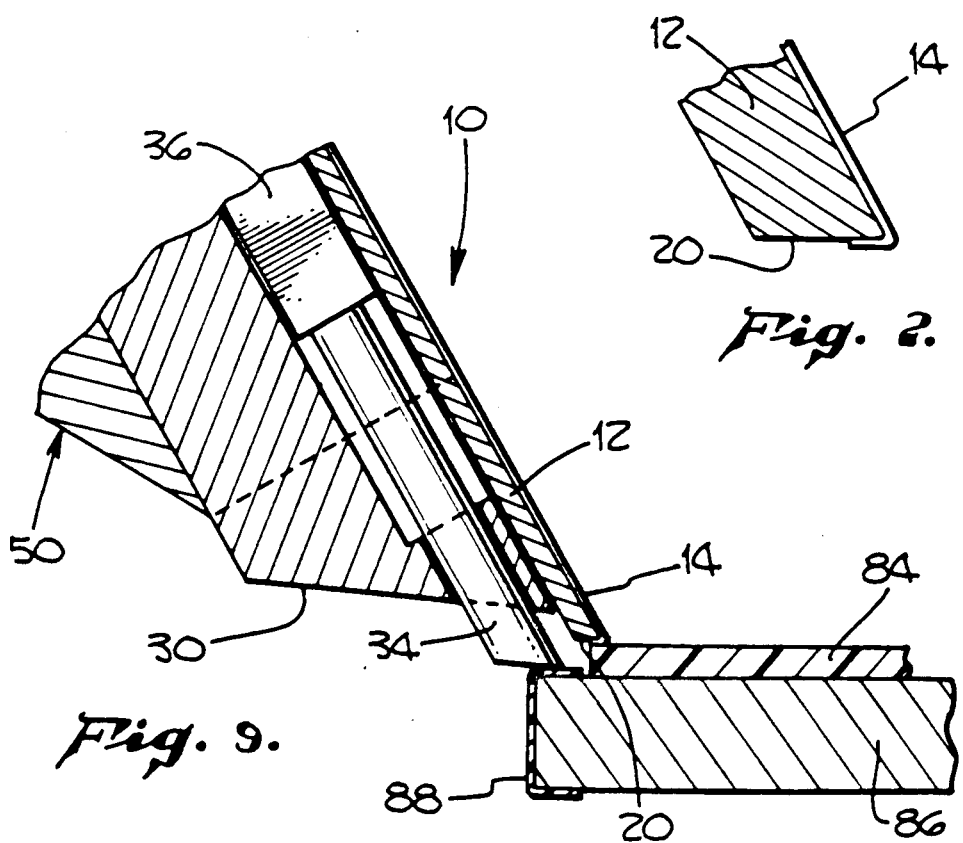
Fig. 2.
Fig. 9.

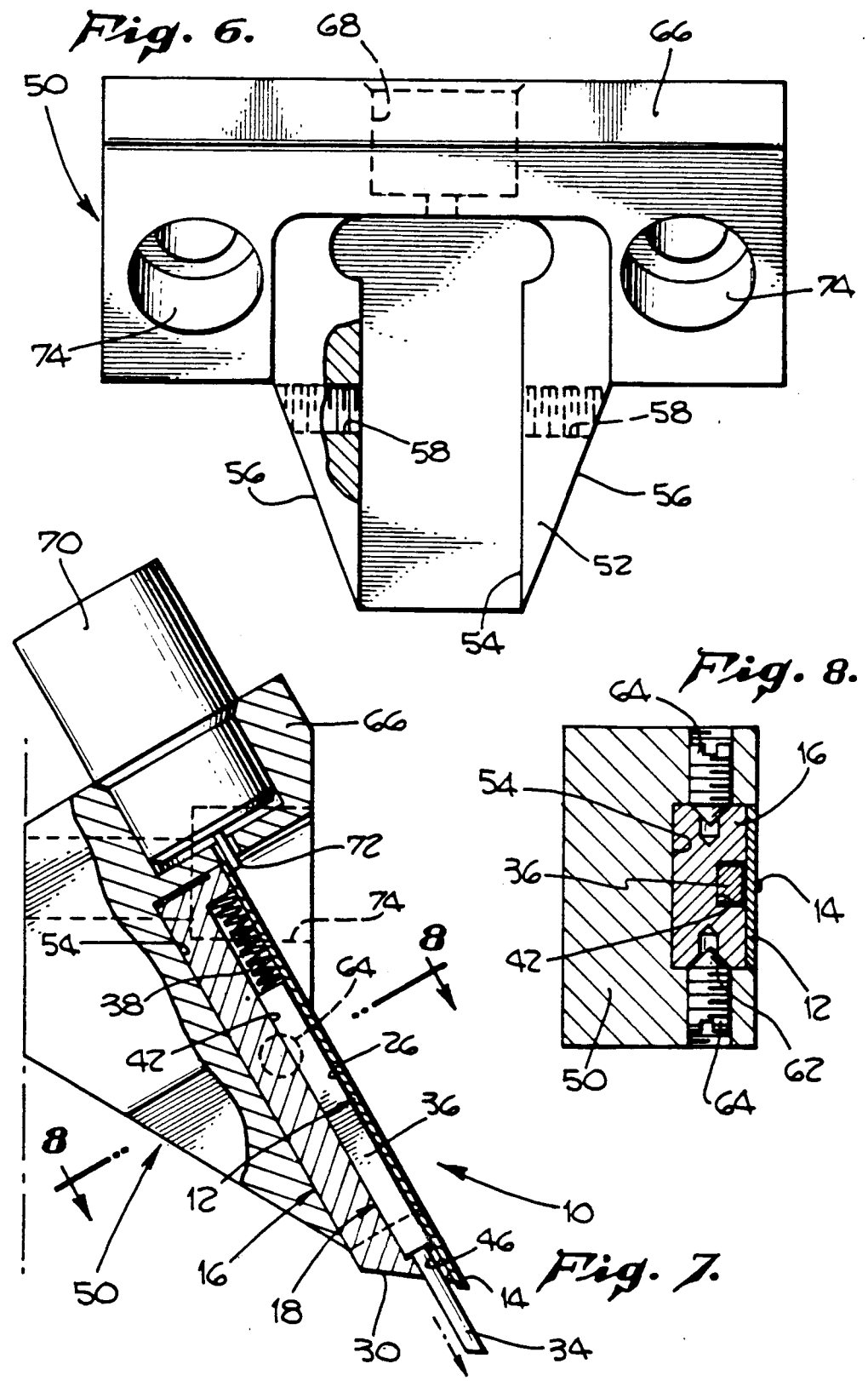

MICROSTRIP PROBE

FIELD OF THE INVENTION

The present invention relates generally to probes useful for connecting external electrical test equipment to selected points on an integrated circuit under test, and more particularly to such a probe designed for making contact to microstrip microwave integrated circuits at the substrate level.

BACKGROUND OF THE INVENTION

RF probes provide temporary electrical contacts between electrical test equipment and very small selected points on an integrated circuit. The use of such probes permits operation and testing of integrated circuit (IC) elements prior to separating, bonding, or packaging of the individual trips contained on the wafer.

However, such prior art probes are generally not suitable for some applications, such as the testing of microstrip microwave integrated circuits (MMIC). MMICs typically include a ground plane on which a microstrip transmission line is placed. The transmission line is constructed typically from an alumina substrate on which the microstrip conductors are arranged to interconnect microwave devices.

A disadvantage and limitation of known prior art probes is that a high quality electrical contact from the probe tip to the microstrip circuit is not always possible. Since the microstrip circuit conductor to which the probe test must make contact is elevated with respect to the ground plane, the dimension of this elevation must be designed into the probe tip so that the electrical contact does not have any discontinuity which could cause unwanted reflections of an RF signal along with the resultant errors in measurement caused by such reflections. However, perfect matching of the probe tip to the MMIC is extremely difficult to maintain. For example, the dielectric substrates may have slight variation in thickness from each other which results in the probe tip not contacting one or the other of the MMIC microstrip signal conductor or ground plane. Also, the orientation angle of the probe tip to the MMIC may not always be constant, also causing discontinuities in the RF signal path.

SUMMARY OF THE INVENTION

It is an important object of the present invention to provide an RF probe which is particularly useful for making electrical contact to microstrip microwave integrated circuits.

According to the present invention, a microstrip probe includes a microstrip transmission line constructed from a dielectric substrate having a conductive microstrip thereon. The substrate is carried by a carrier which forms the ground plane for the microstrip line. A retractable ground pin projects outwardly from the forward edge of the carrier and also extends past the forward edge of the substrate.

An advantage of the present invention is that when the probe tip comes into contact with the MMIC under test, the thickness of the microstrip circuit on the ground plane carrier becomes insignificant. As the retractable ground pin contacts the carrier first, it retracts until the microstrip of the probe comes into contact with the desired microstrip trace on the substrate. Another important advantage of the present invention is that the retractable probe does not cause any damage to the MMIC under test.

These and other objects, advantages and features of the present invention will become readily apparent to those skilled in the art from a study of the following description of an exemplary preferred embodiment of the present invention when read in conjunction with the attached drawings and dependent claims.

BRIEF DESCRIPTION OF THE DRAWINGS

FIG. 1 is an exploded side view of a microstrip probe constructed according to the principles of the present invention.

FIG. 2 is an enlarged portion, broken away, of a detail of the probe shown in FIG. 1.

FIG. 3 is a view taken along line 3—3 of FIG. 1.

FIG. 4 is a view taken along line 4—4 of FIG. 1.

FIG. 5 is a view taken along line 5—5 of FIG. 1.

FIG. 6 is a top view of the probe body shown in FIG. 1.

FIG. 7 is an assembled view, partially in cross-section, of the probe shown in FIG. 1.

FIG. 8 is a cross-sectional view taken along line 8—8 of FIG. 7.

FIGS. 9 and 10 are a side view, partially in cross-section, and a perspective view, respectively, illustrating the use of the probe tip of FIG. 1.

DESCRIPTION OF AN EXEMPLARY PREFERRED EMBODIMENT

Referring to FIG. 1, there is shown an exploded view of a probe 10 constructed according to the principles of the present invention. Probe 10 includes a generally planar dielectric substrate 12, microstrip 14, a substrate carrier 16, an a retractable ground pin 18.

With further reference to FIG. 3, the substrate 12 generally has a first edge 20, a second edge 22, an upper surface 24, and a lower surface 26. In a preferred embodiment of the present invention, the first edge 20 and the second edge 22 are opposing edges. Furthermore, the substrate 12 may also have a lateral taper 28 narrowing toward the first edge 20, as best seen in FIG. 3. The substrate 12 may be constructed from alumina.

The conductive microstrip 14 is disposed on the first surface 24 of the substrate 12 and extends between the first edge 20 and the second edge 22. As best seen in FIG. 2, the conductive microstrip 14 extends and wraps over the first edge 20.

The substrate carrier 16 is substantially coextensive with the substrate 12 and has a forward edge 30 and at least one planar surface 32, as best seen in FIG. 5. Planar surface 32 is in a facing relationship with the lower surface 26 of the substrate 12. The planar surface 32 forms a ground plane. Thus, when assembled, the substrate 12 with the conductive microstrip 14 and the substrate carrier 16 form a microstrip transmission line assembly. With further reference to FIG. 7, the forward edge 30 of the substrate carrier 16 is recessed from the first edge 20 of the substrate 12 when the substrate 12 is mounted thereto.

The retractable ground pin 18 projects outwardly from the forward edge 30 of the substrate carrier 16 and extends past the first edge 20 to the substrate 12, also as best seen in FIG. 7. The pin 18 and the conductive microstrip 14 are generally arranged to be parallel to each other adjacent the first edge 20 of the substrate 12. As best seen in FIG. 7, the retractable ground pin 18 may be constructed from a spring-biased plunger 34 mounted within a housing 36. A spring 38 is disposed between a rear wall 40 and the plunger 34 to bias the plunger 34 outwardly.

Returning to FIG. 5, the substrate carrier 16 includes an elongated channel 42 disposed between the stopping short of the forward edge 30 and rearward edge 44 of the substrate carrier 16. Substrate carrier 16 further includes a bore 46 extending between the forward edge 30 and the channel 42 as best seen in FIGS. 1 and 5. As seen in FIG. 7, the ground pin 18 is received within the channel 42 with the plunger 34 extending through the bore 46.

With reference now to FIGS. 1 and 6, the probe 10 further includes a probe body 50 to which the substrate carrier 16 is mounted. The probe body 50 includes a member 52 having a recess 54 dimensioned to receive the substrate carrier 16. Each lateral side 56 of the member 52 has a threaded bore 58 between the lateral side 56 and the channel 54. Accordingly, the substrate carrier 16 at its lateral edges 60 has a matching bore 62 of frustoconical cross-section in alignment with threaded bores 58. The set screw 64 is received within the threaded bores 58 to engage the frustoconical bore 62, thereby mounting the substrate carrier 16 within the channel 54 of the probe body 50.

The probe body 50 as best seen in FIGS. 6 and 7, has an upstanding rear wall 66 having a bore 68 therein. The bore 68 is dimensioned to receive an electrical connector 70, such as a K-connector. The K-connector provides an electrical connection to external test equipment by coaxial cable. The connector 70 has a signal conductor 72 which engages the microstrip conductor 14 at the second edge 22 of the substrate 24. To secure the substrate 12 onto the substrate carrier 16, a pair of screws (not shown) may be threadingly engages into openings 74 within the probe body 50. Thus, the substrate 12, which forms the active part of the probe 10, may be readily removed and replaced without disassembly of the entire structure of probe 10.

To ensure a non-interrupted ground connection, the substrate carrier 16 at its rear edge 44 includes a protrusion 76 to make positive engagement with the upright wall 66 of the probe body 50. In the embodiment described herein, probe body 50 is of electrically conductive material. Other connectors may be used wherein the ground shield of the connector comes in contact with the protrusion 76.

With reference now to FIGS. 9 and 10, the use of the probe tip 10 is hereinabove described. The probe tip 10 is particularly adapted for making an electrical connection through a microstrip circuit 80 having at least one conductive trace 82 thereon. A typical microstrip circuit is constructed from an alumina substrate 84 on a ground plane 86 with the conductive trace 82 being on the surface of the substrate 84. As best seen in FIG. 9, as the plunger 34 comes in contact with the ground plane 86, it is retracted until the microstrip conductor 14 engages the conductive trace 82. Thus, a positive electrical connection is always made between the probe 10 and the circuit 80. The edge 20, plunger 34 and edge 30 are all beveled, such that the edges are generally parallel to the circuit 80 under test. To prevent unwanted RF reflections, a strip of microwave absorbing material 88 may be disposed between the ground plane 86 and plunger 34. Typical microwave absorbing material is commercially available under the ECOSORB trademark.

There has been described hereinabove a novel probe for testing MMICs. It is apparent that those skilled in the art may now make numerous uses of and departures from the description of the exemplary preferred embodiment without departing from the inventive concepts disclosed herein. Accordingly, the present invention is to be described solely by the scope of the following claims.

I claim:

1. A microstrip probe comprising:
    a generally planar dielectric substrate having a first edge, a second edge, an upper surface and a lower surface;
    a conductive microstrip disposed on said first surface and extending between said first edge and said second edge;
    a substrate carrier being substantially coextensive with said substrate and having a forward edge and at least one planar surface in a facing relationship to said second surface of said substrate, said planar surface being a ground plane, said forward edge being recessed from said first edge; and
    a retractable ground pin projecting outwardly from said forward edge of said substrate carrier and extending past said first edge of said substrate, said pin and said conductive microstrip being generally parallel at said first edge.

2. A probe as set forth in claim 1 wherein said substrate is alumina.

3. A probe as set forth in claim 1 wherein said first edge and said second edge are opposing edges.

4. A probe as set forth in claim 3 wherein said substrate has a lateral taper narrowing toward said first edge.

5. A probe as set forth in claim 1 wherein said conductive microstrip extends over said first edge.

6. A probe as set forth in claim 1 further comprising:
    a probe body, said substrate carrier being mounted to said probe body; and
    an electrical connector carried by said probe body, said connector having a signal conductor and a ground conductor, said signal conductor engaging said microstrip conductor at said second edge when said substrate is mounted to said substrate carrier, said probe carrier engaging said ground conductor.

7. A probe as set forth in claim 6 wherein said substrate carrier has a further edge, said further edge having a protrusion in engagement with said ground conductor.

8. A probe as set forth in claim 1 wherein said substrate is releasably attached to said carrier.

* * * * *